United States Patent
Pan

(10) Patent No.: US 7,440,732 B2
(45) Date of Patent: Oct. 21, 2008

(54) APPARATUS AND METHOD OF LOCAL OSCILLATOR LEAKAGE CANCELLATION

(75) Inventor: Meng-An Pan, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 459 days.

(21) Appl. No.: 11/211,565

(22) Filed: Aug. 26, 2005

(65) Prior Publication Data

US 2007/0049220 A1  Mar. 1, 2007

(51) Int. Cl.
*H04B 1/04* (2006.01)
*H01Q 11/12* (2006.01)

(52) U.S. Cl. .................. 455/91; 455/114.2; 455/118; 455/127.2; 375/296

(58) Field of Classification Search .............. 455/114.2, 455/114.3, 118–119, 199, 126–127.5; 375/296, 375/284–285, 278
See application file for complete search history.

(56) References Cited

U.S. PATENT DOCUMENTS

| | | | |
|---|---|---|---|
| 5,012,208 A * | 4/1991 | Makinen et al. ............. | 332/103 |
| 5,396,196 A | 3/1995 | Blodgett | |
| 5,675,286 A | 10/1997 | Baker et al. | |
| 5,903,823 A | 5/1999 | Moriyama et al. | |
| 6,169,463 B1 * | 1/2001 | Mohindra et al. ........... | 332/104 |
| 6,704,551 B2 | 3/2004 | Riou et al. | |
| 7,206,557 B2 * | 4/2007 | Aytur et al. .................. | 455/118 |
| 7,280,805 B2 * | 10/2007 | Xu et al. .................. | 455/67.11 |
| 2002/0191713 A1 * | 12/2002 | McVey ....................... | 375/308 |
| 2006/0063497 A1 * | 3/2006 | Nielsen ....................... | 455/118 |
| 2006/0252392 A1 | 11/2006 | Beamish et al. | |
| 2007/0042728 A1 | 2/2007 | Pan | |

* cited by examiner

*Primary Examiner*—Simon D Nguyen
(74) *Attorney, Agent, or Firm*—Sterne, Kessler, Goldstein & Fox P.L.L.C.

(57) ABSTRACT

A transmitter includes a first mixer to generate a first output signal by up-converting a first baseband signal having a first DC offset component. A second mixer generates a second output signal by up-converting a second baseband signal having a second DC offset component. The second output signal is subtracted from the first output signal to generate a transmitter output signal. The transmitter output signal includes a local oscillator (LO) leakage signal caused by the first and/or second DC offset components. A third mixer produces a third output signal by up-converting the first DC offset component. A fourth mixer produces a fourth output signal by up-converting the second DC offset component. The fourth output signal is subtracted from the third output signal to generate a LO leakage cancellation signal. The LO leakage cancellation signal is subtracted from the transmitter output signal, thereby reducing a power of the LO leakage signal.

20 Claims, 9 Drawing Sheets

APPARATUS AND METHOD OF LOCAL OSCILLATOR LEAKAGE CANCELLATION

BACKGROUND OF THE INVENTION

1. Field of the Invention

The present invention generally relates to local oscillator (LO) leakage signal reduction. More specifically, the present invention provides LO leakage signal cancellation using baseband DC offsets.

2. Background Art

Generally, a wireless radio frequency (RF) transmitter includes a baseband section and an RF section. Baseband information signals are generated and manipulated within the baseband section. The baseband information signals are up-converted and further manipulated within the RF section to produce a transmitter output signal.

Random device mismatches within the constituent components of the baseband section can produce DC offsets within the baseband information signals. These baseband DC offsets can be up-converted by the transmitter to produce a LO leakage signal. The LO leakage signal is an undesirable signal that can interfere with the subsequent detection and demodulation of the transmitter output signal.

The quality of the transmitter output signal suffers if a transmitter fails to compensate for the baseband DC offset component of a LO leakage signal. Many techniques to reduce a power of the LO leakage signal rely on complicated calibration circuits designed to compensate for baseband DC offsets. Such calibration circuits are often expensive in terms of required processing power and required additional components. Further, re-calibration of the compensation of baseband DC offsets is required every time the transmitter gain is changed or every time the transmitter operating point is changed. Consequently, design, manufacturing and operating costs of the transmitter are increased.

BRIEF SUMMARY OF THE INVENTION

Accordingly, the present invention provides improved reduction or elimination of a LO leakage signal in a transmitter output signal caused by baseband DC offsets.

In one embodiment, a transmitter includes a first mixer to generate a first output signal by up-converting a first baseband signal having a first DC offset component. A second mixer generates a second output signal by up-converting a second baseband signal having a second DC offset component. The second output signal is subtracted from the first output signal to generate a transmitter output signal. The transmitter output signal includes a local oscillator (LO) leakage signal caused by the first and/or second DC offset components. A first filter filters the first baseband signal to isolate the first DC offset component. A third mixer produces a third output signal by up-converting the first DC offset component provided by the first filter. A second filter filters the second baseband signal to isolate the second DC offset component. A fourth mixer produces a fourth output signal by up-converting the second DC offset component provided by the second filter. The fourth output signal is subtracted from the third output signal to generate a LO leakage cancellation signal. The LO leakage cancellation signal is subtracted from the transmitter output signal, thereby reducing a power of the LO leakage signal.

In another embodiment, there is provided a method for reducing a power of a LO leakage signal in a transmitter output signal. A transmitter output signal is generated from one or more baseband signals. At least one of the one or more baseband signals includes a DC offset component. The transmitter output signal includes a LO leakage signal component caused by each DC offset component. A LO leakage cancellation signal is generated from each DC offset components. The LO leakage cancellation signal is subtracted from the transmitter output signal. Consequently, the power of the LO leakage signal is reduced or eliminated.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 10:
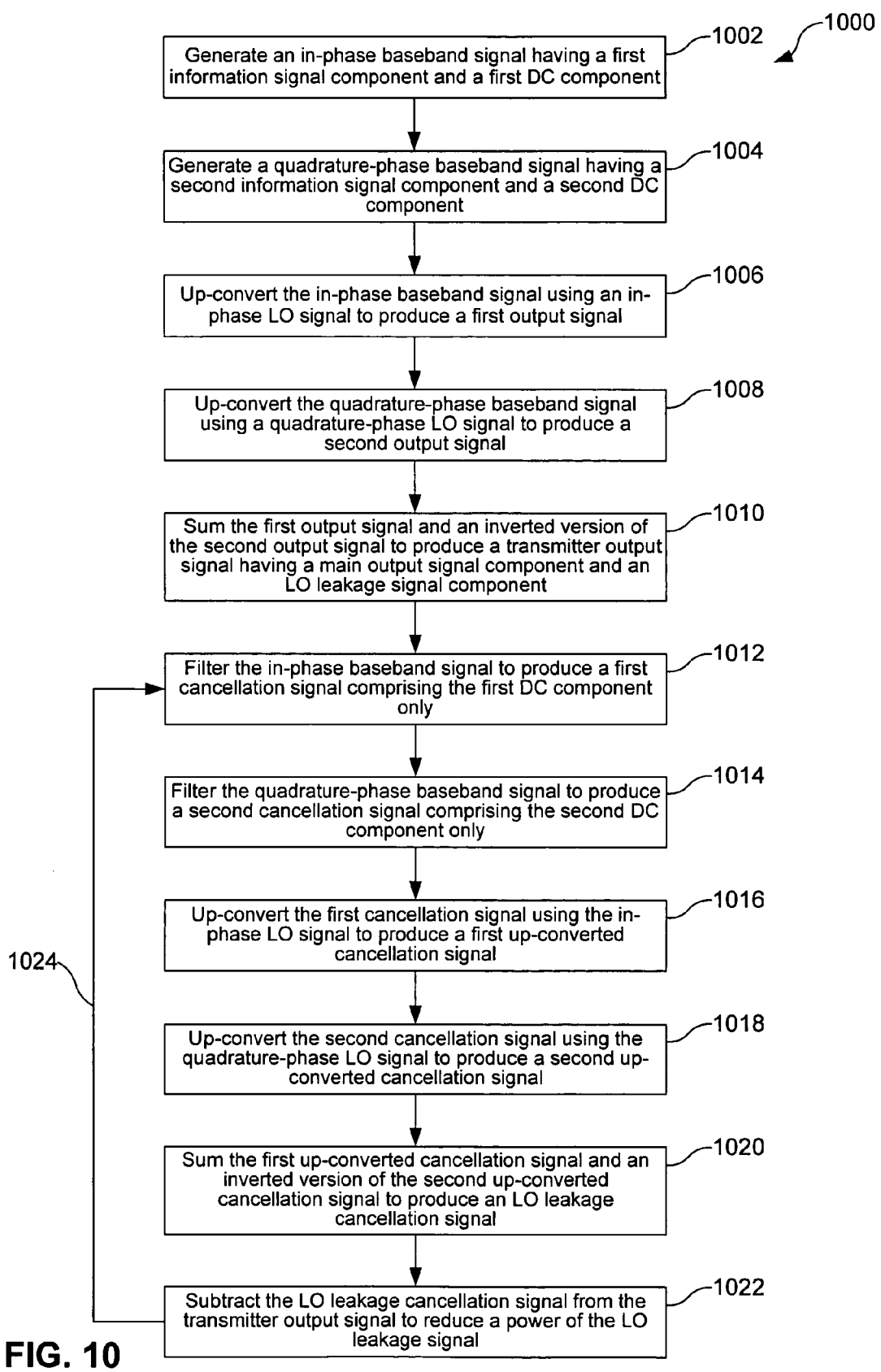

FIG. 10 provides a flowchart that illustrates operational steps for reducing or eliminating a LO leakage signal in a transmitter output signal caused by baseband DC offsets in accordance with the present invention.

DETAILED DESCRIPTION OF THE INVENTION

Figure 1:
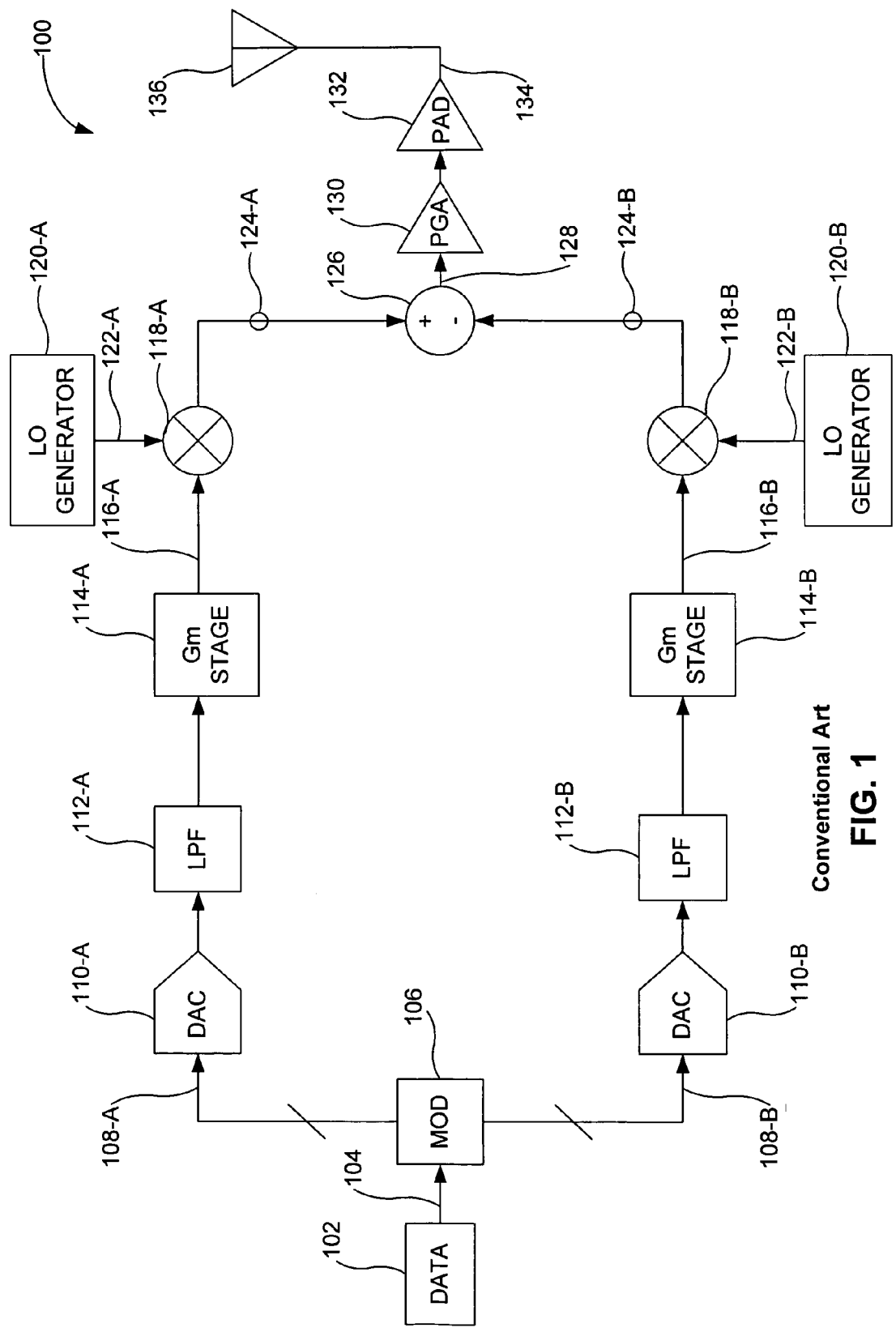
FIG. 1 illustrates a conventional wireless transmitter.

FIG. 1 illustrates a conventional wireless transmitter 100. The conventional wireless transmitter 100 includes an information source 102. The information source 102 generates a data signal 104. The data signal 104 is a sequence of bits. The information source 102 provides the data signal 104 to a modulator 106. The modulator 106 encodes and modulates the data signal 104 and provides two modulation channels (e.g., an in-phase channel and a quadrature-phase channel). Specifically, the modulator 106 generates a modulated data signal 108-A and an associated modulated data signal 108-B. The modulated data signals 108-A and 108-B can be baseband signals or can be signals centered at an intermediate frequency (IF). The modulated data signals 108-A and 108-B can be considered to be in-phase and quadrature-phase information signals, respectively. At the output of the modulator 106, the modulated data signals 108-A and 108-B are multiple-bit digital signals.

As illustrated in FIG. 1, the modulated data signals 108-A and 108-B are provided to digital-to-analog converters (DACs) 110-A and 110-B and to low-pass filters (LPFs) 112-A and 112-B, respectively. The DAC 110-A converts the modulated data signal 108-A from a digital signal into a differential analog signal. The LPF 112-A isolates an appropriate portion of the modulated data signal 108-A for transmission. Similarly, the DAC 10-B converts the modulated data signal 108-B from a digital signal to a differential analog signal and the LPF 112-B isolates an appropriate portion of the modulated data signal 108-B for transmission.

A transconductance stage 114-A converts the modulated data signal 108-A from a differential voltage signal into a differential current signal. Likewise, a transconductance stage 114-B converts the modulated data signal 108-B from a differential voltage signal into a differential current signal.

The conventional wireless transmitter 100 further includes a pair of mixers 118-A and 118-B. A first input of the mixer 118-A receives an in-phase data signal 116-A from an output of the transconductance stage 114-A. A first input of the mixer 118-B receives a quadrature-phase data signal 116-B from an output of the transconductance stage 114-B. A local oscillator (LO) generator 120-A generates an in-phase LO signal 122-A. The in-phase LO signal 122-A is provided to a second input of the mixer 118-A. A LO generator 120-B generates and provides a quadrature-phase LO signal 122-B to a second input of the mixer 118-B.

The in-phase LO signal 122-A and the quadrature-phase LO signal 122-B are typically high frequency periodic waveforms. For example, the in-phase LO signal 122-A and the quadrature-phase LO signal 122-B can be radio frequency (RF) signals. The in-phase LO signal 122-A and the quadrature-phase LO signal 122-B are of approximately the same frequency (i.e., a LO frequency, $f_{LO}$). Further, the quadrature-phase LO signal 122-B is typically a phase shifted version of the in-phase LO signal 122-A (i.e., phase shifted by approximately −90°).

The mixer 118-A uses the in-phase LO signal 122-A to up-convert the in-phase data signal 116-A to a higher frequency. Specifically, the mixer 118-A receives the in-phase data signal 116-A as a differential analog signal and produces a frequency-translated version of the in-phase data signal (shown as up-converted in-phase signal 124-A) that is also a differential analog signal. Similarly, the mixer 118-B uses the quadrature-phase LO signal 122-B to up-convert the in-phase data signal 116-B to a higher frequency. The mixer 118-B receives the in-phase data signal 116-B as a differential analog signal and produces a frequency-translated version of the modulated data signal (shown as up-converted quadrature-phase signal 124-B) that is also a differential analog signal. In this way, the in-phase data signal 116-A can be up-converted to an RF frequency by the mixer 118-A to produce the up-converted in-phase signal 124-A. Further, the quadrature-phase data signal 116-B can be up-converted to an RF frequency by the mixer 118-B to produce the up-converted quadrature-phase signal 124-B.

As further illustrated in FIG. 1, the outputs of the mixers 118-A and 118-B are provided to an inverting summer 126. The inverting summer 126 subtracts the differential components of the up-converted quadrature-phase signal 124-B from the corresponding differential components of the up-converted in-phase signal 124-A. In other words, the inverting summer 126 sums the up-converted in-phase signal 124-A with an inverted version of the up-converted quadrature-phase signal 124-B. As a result, the inverting summer 126 produces an up-converted modulated signal 128. The up-converted modulated signal 128 is a differential signal.

The inverting summer 126 is coupled to a programmable gain amplifier (PGA) 130. The PGA 130 amplifies the up-converted modulated signal 128. The gain of the PGA 130 is typically programmable, or variable, and so can be adjusted during operation of the conventional wireless transmitter 100. The PGA 130 is coupled to a power amplifier driver (PAD) 132. The PAD 132 also amplifies the up-converted modulated signal 128 and produces a transmitter output signal 134. The gain of the PAD 132 is typically fixed and so cannot be adjusted during operation of the conventional wireless transmitter 100. The transmitter output signal 134 is provided to an antenna 136 for wireless transmission.

The mixers 118-A and 118-B divide the conventional wireless transmitter 100 into a baseband section and an RF section. Specifically, the information source 102, the modulator 106, the DACs 110-A and 110-B, the LPFs 112-A and 112-B and the transconductance stages 114-A and 114-B are constituent components of the baseband section of the conventional wireless transmitter 100. In contrast, the LO generators 120-A and 120-B, the inverting summer 126, the PGA 130 the PAD 132 and the antenna 136 are constituent components of the RF section of the conventional wireless transmitter 100.

The conventional wireless transmitter 100 can be a generalized in-phase/quadrature-phase transmitter. Specifically, the conventional wireless transmitter 100 can be adapted to provide various types of modulated data signals 108-A and 108-B by implementing a variety of modulation schemes with the modulator 106. Further, the conventional wireless transmitter 100 can be adapted to up-convert the in-phase data signal 116-A and the quadrature-phase data signal 116-B onto a variety of transmission channel bandwidths by altering the LPFs 112-A and 112-B and the in-phase LO signal 122-A and the quadrature-phase LO signal 122-B. Overall, the conventional wireless transmitter 100 can be modified to provide a transmitter output signal 134 (and up-converted modulated signal 128) that conforms to a variety of communication protocols, standards, or known schemes. The conventional wireless transmitter 100 can be implemented, for example, as a Institute of Electrical and Electronics Engineers (IEEE) 802.11a/g transmitter.

The conventional wireless transmitter 100 can operate as a single sideband transmitter. Under ideal conditions, the transmitter output signal 134 produced by the conventional wireless transmitter 100 includes a main information signal component only. Under non-ideal conditions, however, the amplified modulated signal 134 includes the main information signal component and a LO leakage signal component. The LO leakage signal is an undesirable signal that can interfere with the reception and demodulation of the main information signal by a corresponding wireless receiver. Further, the LO leakage signal does not convey information provided by the information source 102.

The LO leakage signal can be caused by a baseband DC offset within the baseband section of the conventional wireless transmitter 100. A baseband DC offset can be introduced within the in-phase or quadrature-phase baseband sections of the conventional wireless transmitter 100. For example, a DC offset between the differential components of the in-phase data signal 116-A causes the in-phase data signal 116-A, at the input of the mixer 118-A, to include a DC component. As a result, the DC component of the in-phase data signal 116-A is up-converted to the frequency of the in-phase LO signal 122-A (i.e., the LO frequency, $f_{LO}$) and can subsequently appear in the up-converted modulated signal 128 (and, consequently, the transmitter output signal 134).

Alternatively, a baseband DC offset can be caused by a DC offset between the differential components of the quadrature-phase data signal 116 B. A DC offset between the differential components of the quadrature-phase data signal 116-B causes the quadrature-phase data signal 116-B, at the input of the mixer 118-B, to include a DC component. As a result, the DC component of the quadrature-phase data signal 116-B is up-converted to the frequency of the quadrature-phase LO signal 126 (i.e., the LO frequency, $f_{LO}$) and can subsequently appear in the up-converted modulated signal 128 (and, consequently, the transmitter output signal 134).

The LO leakage signal is not generated or produced under ideal operating conditionals of the conventional wireless transmitter 100. Ideal operating conditions therefore require the in-phase data signal 116-A and the quadrature-phase data signal 116-B to not include a DC component at the inputs of the mixers 118-A and 118-B, respectively.

Figure 2A:
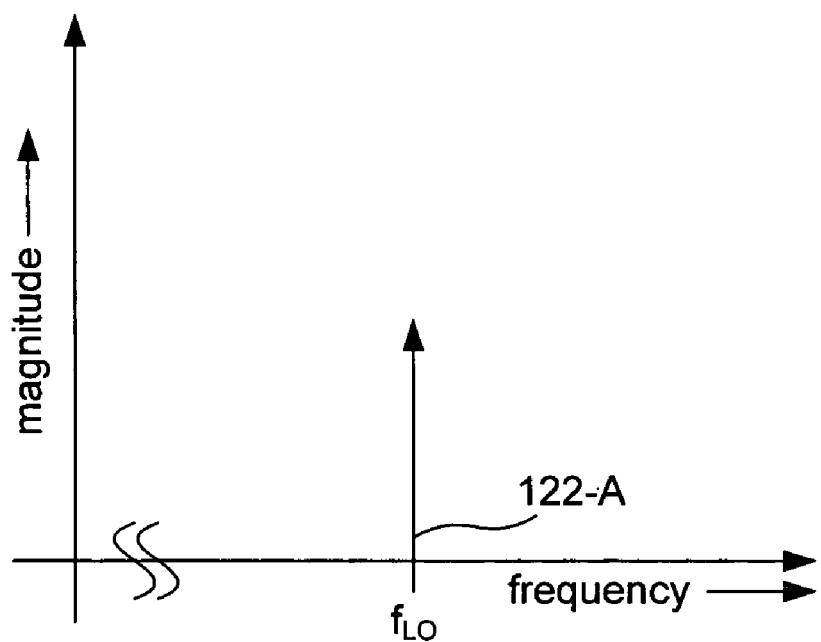
FIG. 2A illustrates a magnitude spectrum of an in-phase local oscillator (LO) signal depicted in FIG. 1.
Figure 2B:
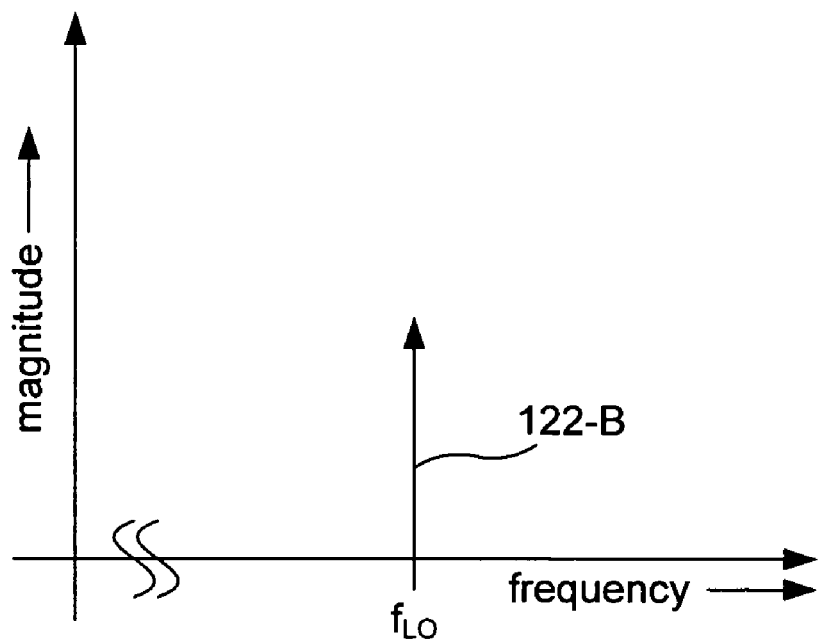
FIG. 2B illustrates a magnitude spectrum of a quadrature-phase LO signal depicted in FIG. 1.

FIG. 2A illustrates the magnitude spectrum of the in-phase LO signal 122-A. FIG. 2B illustrates the magnitude spectrum of the quadrature-phase LO signal 122-B. The in-phase LO signal 122-A and the quadrature-phase LO signal 122-B each comprise a single tone centered at the LO frequency, $f_{LO}$. As previously mentioned, the LO frequency is typically a frequency much greater than baseband. Mathematically, the in-phase LO signal 122-A can be represented as:

$$LO_I = \cos X \tag{1}$$

$$= \cos(2\pi f_{LO} t) \tag{2}$$

and the quadrature-phase LO signal 122-B can be represented as:

$$LO_Q = \sin X \tag{3}$$

$$= \sin(2\pi f_{LO} t) \tag{4}$$

Figure 3A:
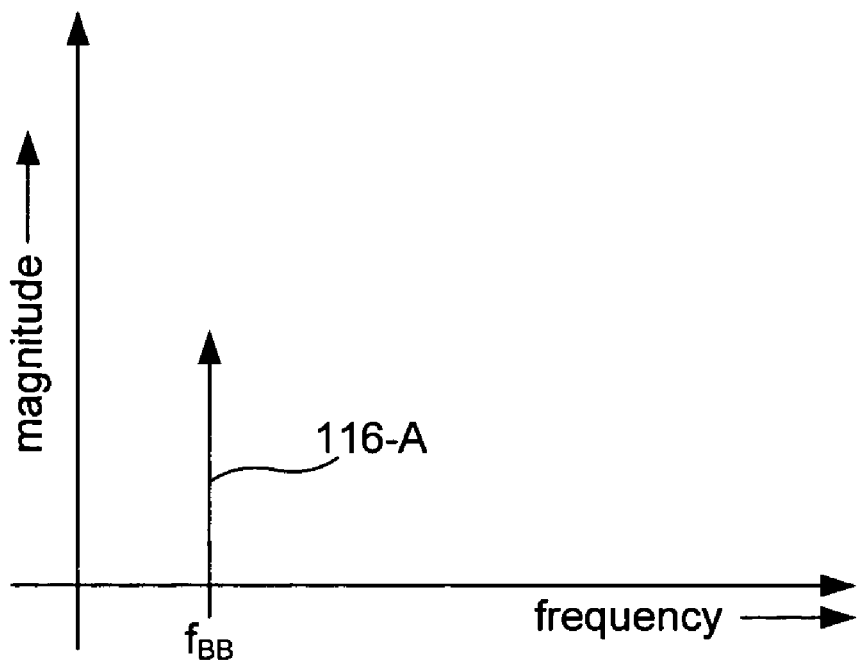
FIG. 3A illustrates a magnitude spectrum of an in-phase data signal depicted in FIG. 1.
Figure 3B:
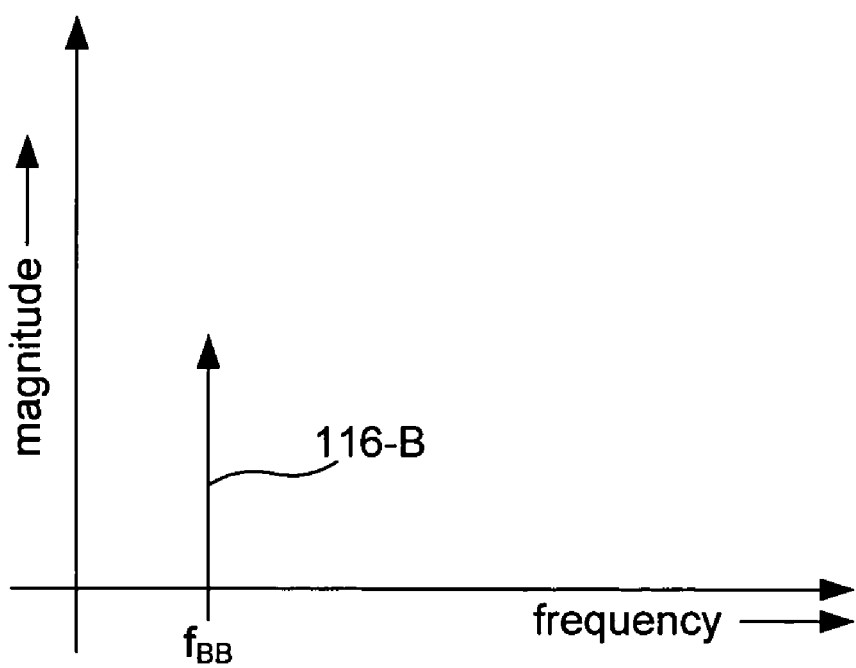
FIG. 3B illustrates a magnitude spectrum of an quadrature-phase data signal depicted in FIG. 1.

FIG. 3A illustrates the magnitude spectrum of the in-phase data signal 116-A. FIG. 3B illustrates the magnitude spectrum of the quadrature-phase data signal 116-B. For simplicity, the in-phase data signal 116-A and the quadrature-phase data signal 116-B are each depicted as comprising a single tone centered at a signal frequency, $f_{BB}$. As previously mentioned, the signal frequency is typically a relatively low frequency with respect to the LO frequency. When the modulator 106 outputs a single tone signal, the in-phase data signal 116-A can be mathematically represented as:

$$S_I = A \cos Y \tag{5}$$

$$= A \cos(2\pi f_{BB} t) \tag{6}$$

and the quadrature-phase data signal 116-B can be represented as:

$$S_Q = A \sin Y \tag{7}$$

$$= A \sin(2\pi f_{BB} t) \tag{8}$$

where A represents peak amplitude.

Equations 5 through 8 (and FIGS. 3A and 3B) correspond to the ideal case where neither the in-phase data signal 116-A nor the quadrature-phase data signal 116-B includes a DC offset component. Given this condition, the up-converted modulated signal 128 can be represented as:

$$TX_{output} = S_I \cdot LO_I - S_Q \cdot LO_Q \tag{9}$$

$$= A\cos(2\pi f_{BB}t)\cos(2\pi f_{LO}t) - A\sin(2\pi f_{BB}t)\sin(2\pi f_{LO}t) \tag{10}$$

$$= A\cos[2\pi(f_{LO} + f_{BB})t] \tag{11}$$

Figure 4:
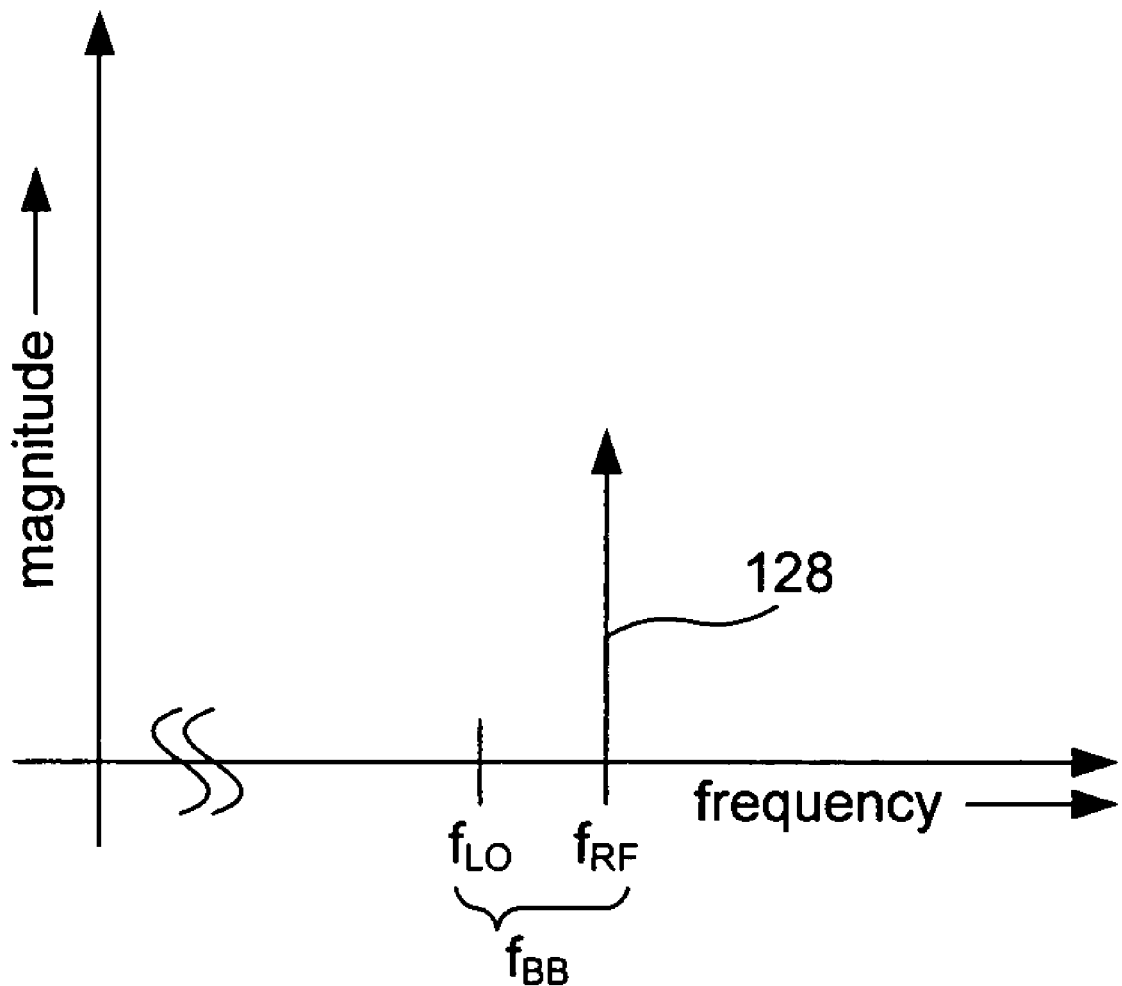
FIG. 4 illustrates a magnitude spectrum of an up-converted modulated signal having a main information signal component only.

Equation 11 shows that the up-converted modulated signal 128 comprises a main information signal component only. That is, the up-converted modulated signal 128 does not include a LO leakage signal. FIG. 4 illustrates the magnitude spectrum of the up-converted modulated signal 128 when neither the in-phase data signal 116-A nor the quadrature-phase data signal 116-B includes a DC offset component. As shown in FIG. 4, the up-converted modulated signal 128 comprises a single tone centered at a radio frequency, $f_{RF}$, such that:

$$f_{RF} = f_{LO} + f_{BB} \tag{12}$$

FIG. 4 further shows that the main information signal component of the up-converted modulated signal 128 is not corrupted by a LO leakage signal under ideal operating conditions of the conventional wireless transmitter 100.

As previously mentioned, the transmitter output signal 136 includes a LO leakage signal when the conventional wireless transmitter 100 operates under non-ideal conditions. The introduction of a LO leakage signal component within the up-converted modulated signal 128 as caused by a baseband DC offset is discussed below.

Both the in-phase data signal 116-A and the quadrature-phase data signal 116-B are differential signals. The in-phase data signal 116-A can be represented as:

$$S_I = I_p - I_n \tag{13}$$

where $I_p$ represents a first differential component of the in-phase data signal 116-A and $I_n$ represents a second differential component of the in-phase data signal 116-A. The first differential component of the in-phase data signal 116-A can be represented as:

$$I_p = DC_{I,p} + \frac{A}{2}\cos(2\pi f_{BB} t) \tag{14}$$

and the second differential component of the in-phase data signal 116-A can be represented as:

$$I_n = DC_{I,n} - \frac{A}{2}\cos(2\pi f_{BB} t) \qquad (15)$$

where $DC_{I,p}$ represents a DC component of $I_p$ and $DC_{I,n}$ represents a DC component of $I_n$.

Under ideal conditions, a DC imbalance does not exist between the first and second differential components of the in-phase data signal 116-A. That is, under ideal conditions, the DC components of the first and second differential components of the in-phase data signal 116-A are equal (i.e., $DC_{I,p}=DC_{I,n}$) such that:

$$S_I = DC_{I,p} + \frac{A}{2}\cos(2\pi f_{BB}t) - DC_{I,n} + \frac{A}{2}\cos(2\pi f_{BB}t) \qquad (16)$$

$$= A\cos(2\pi f_{BB}t) \qquad (17)$$

Equation 17 corresponds to the ideal case represented by Equation 6 and is illustrated by FIG. 3A.

Figure 5A:
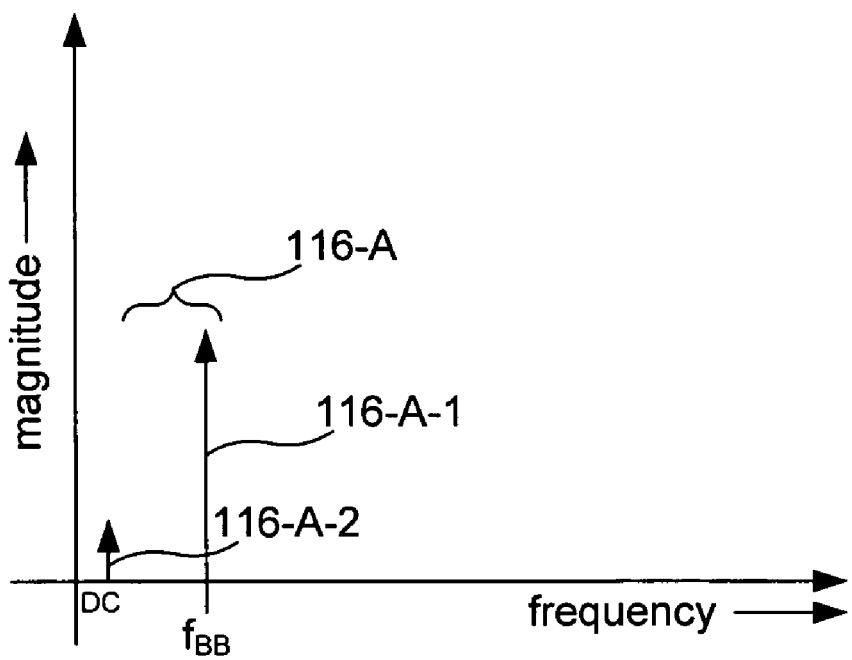
FIG. 5A illustrates the magnitude spectrum of the in-phase data signal having a main baseband signal component and a DC offset component.

Under non-ideal conditions, a DC imbalance exists between the first and second differential components of the in-phase data signal 116-A (i.e., $DC_{I,p} \neq DC_{I,n}$). When a DC imbalance exists between the first and second differential components of the in-phase data signal 116-A, the in-phase data signal 116-A includes a DC offset term, DC, offset, such that:

$$S_I = DC_{I,p} - DC_{I,n} + A\cos(2\pi f_{BB}t) \qquad (18)$$

$$= DC_{I,offset} + A\cos(2\pi f_{BB}t) \qquad (19)$$

where $DC_{I,offset}$ can be either a positive offset or a negative offset. FIG. 5A illustrates the magnitude spectrum of the in-phase data signal 116-A having a main baseband signal component 116-A-1 and a DC offset component 116-A-2. Comparing FIG. 5A to FIG. 3A reveals that a DC imbalance between the first and second differential components of the in-phase data signal 116-A results in the in-phase data signal 116-A including spurious energy centered around DC (i.e., the DC offset component 116-A-2).

The quadrature-phase data signal 116-B can be represented as:

$$S_Q = Q_p - Q_n \qquad (20)$$

where $Q_p$ represents a first differential component of the quadrature-phase data signal 116-B and $Q_n$ represents a second differential component of the quadrature-phase data signal 116-B. The first differential component of the quadrature-phase data signal 116-B can be represented as:

$$Q_p = DC_{Q,p} + \frac{A}{2}\sin(2\pi f_{BB}t) \qquad (21)$$

and the second differential component of the quadrature-phase data signal 116-B can be represented as:

$$Q_n = DC_{Q,n} - \frac{A}{2}\sin(2\pi f_{BB}t) \qquad (22)$$

where $DC_{Q,p}$ represents a DC component of $Q_p$ and $DC_{Q,n}$ represents a DC component of $Q_n$.

Under ideal conditions, a DC imbalance does not exist between the first and second differential components of the quadrature-phase data signal 116-B. That is, under ideal conditions, the DC components of the first and second differential components of the quadrature-phase data signal 116-B are equal (i.e., $DC_{Q,p}=DC_{Q,n}$) such that:

$$S_Q = DC_{Q,p} + \frac{A}{2}\sin(2\pi f_{BB}t) - DC_{Q,n} + \frac{A}{2}\sin(2\pi f_{BB}t) \qquad (23)$$

$$= A\sin(2\pi f_{BB}t) \qquad (24)$$

Equation 24 corresponds to the ideal case represented by Equation 8 and is illustrated by FIG. 3B.

Figure 5B:
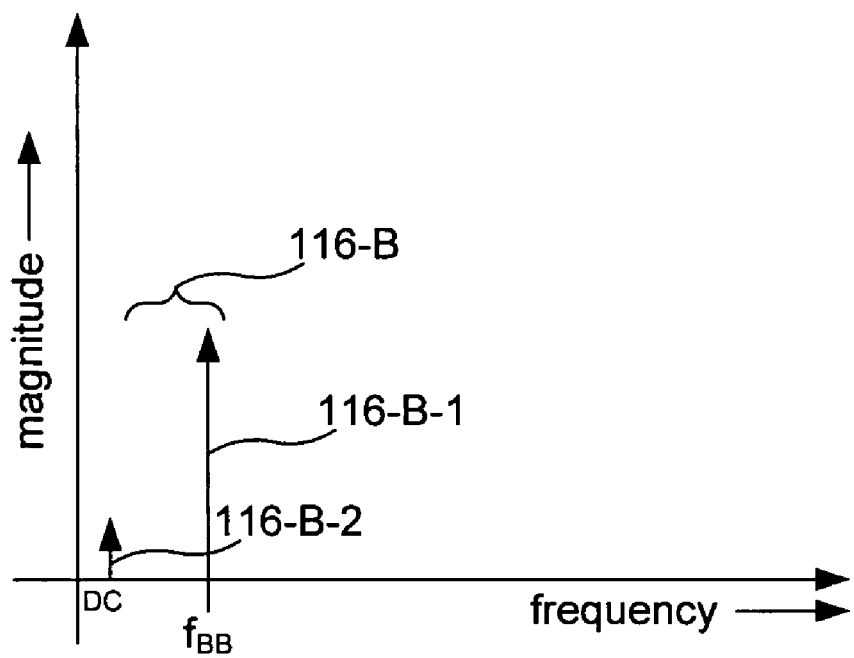
FIG. 5B illustrates the magnitude spectrum of the quadrature-phase data signal having a main baseband signal component and a DC offset component.

Under non-ideal conditions, a DC imbalance exists between the first and second differential components of the quadrature-phase data signal 116-B (i.e., $DC_{Q,p} \neq DC_{Q,n}$). When a DC imbalance exists between the first and second differential components of the quadrature-phase data signal 116-B, the quadrature-phase data signal 116-B includes a DC offset term, $DC_{Q,offset}$, such that:

$$S_Q = DC_{Q,p} - DC_{Q,n} + A\sin(2\pi f_{BB}t) \qquad (25)$$

$$= DC_{Q,offset} + A\sin(2\pi f_{BB}t) \qquad (26)$$

where $D_{Q,offset}$ can be either a positive offset or a negative offset. FIG. 5B illustrates the magnitude spectrum of the quadrature-phase data signal 116-B having a main baseband signal component 116-B-1 and a DC offset component 116-B-2. Comparing FIG. 5B to FIG. 3B reveals that a DC imbalance between the first and second differential components of the quadrature-phase data signal 116-B results in the quadrature-phase data signal 116-B including spurious energy centered around DC (i.e., the DC offset component 116-B-2).

The DC offset component 116-A-2 of the in-phase data signal 116-A is fed to the mixer 118-A. Similarly, the DC offset component 116-B-2 of the quadrature-phase data signal 116-B is fed to the mixer 118-B. As a result, the DC offset components 116-A-2 and 116-B-2 are frequency translated or up-converted to the LO frequency, $f_{LO}$. When the in-phase data signal 116-A includes the DC offset component 116-A-2 and the quadrature-phase data signal 116-B includes the DC offset component 116-B-2, the up-converted modulated signal 128 can be represented as:

$$TX_{output} = S_I \cdot LO_I - S_Q \cdot LO_Q \qquad (27)$$

$$= [DC_{I,offset} + A\cos(2\pi f_{BB}t)]\cos(2\pi f_{LO}t) \qquad (28a)$$

$$-[DC_{Q,offset} + A\sin(2\pi f_{BB}t)]\sin(2\pi f_{LO}t) \qquad (28b)$$

-continued $$= A\cos[2\pi(f_{LO} + f_{BB}t] \quad (29a)$$

$$+ DC_{I,\text{offset}}\cos(2\pi f_{LO}t) - DC_{Q,\text{offset}}\sin(2\pi f_{LO}t) \quad (29b)$$

Equation 29a represents a main information signal component 128-A of the up-converted modulated signal 128. Equation 29b represents a LO leakage signal component 128-B of the up-converted modulated signal 128. Since the transmitter output signal 134 is an amplified version of the up-converted modulated signal 128, then the transmitter output signal will include a LO leakage signal component (i.e., an amplified version of the LO leakage signal component 128-B).

Figure 6:
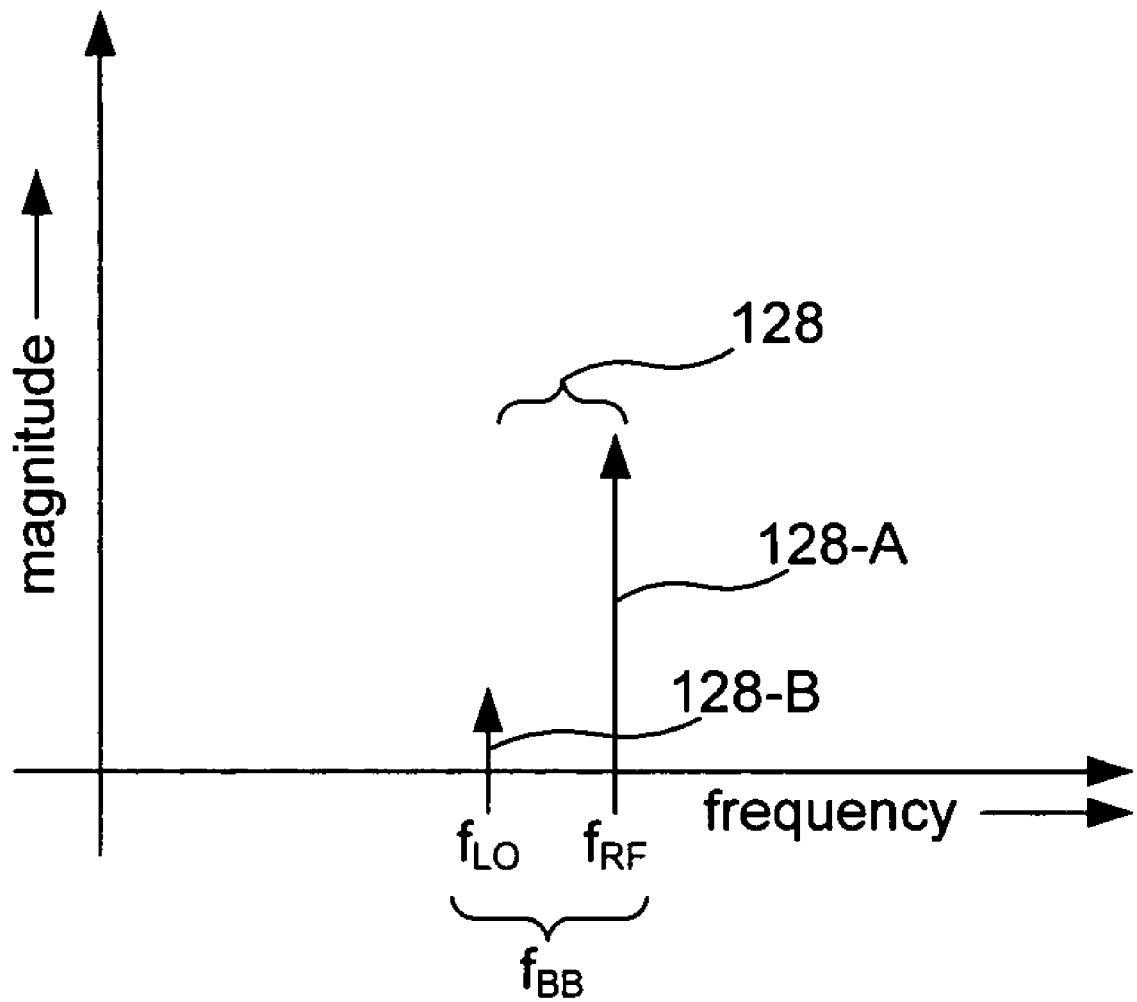
FIG. 6 illustrates the magnitude spectrum of the up-converted modulated signal having a main information signal component and a LO leakage signal component.

FIG. 6 illustrates the magnitude spectrum of the up-converted modulated signal 128 generated from the in-phase data signal 116-A having a DC offset component 116-A-2 and the quadrature-phase data signal 116-B having a DC offset component 116-B-2. As shown in FIG. 6, the up-converted modulated signal 128 includes the main information signal component 128-A centered at the RF frequency, $f_{RF}$, and a LO leakage signal component 128-B centered at the LO frequency, $f_{LO}$. Therefore, a DC imbalance between the first and second differential components of the in-phase data signal 116-A and the quadrature-phase data signal 116-B causes the up-converted modulated signal 128 to include the LO leakage signal 128-B.

Equation 29a shows that a DC imbalance between the first and second differential components of the in-phase data signal 116-A or the quadrature-phase data signal 116-B causes the up-converted modulated signal 128 to include the LO leakage signal 128-B. That is, the LO leakage signal 128-B depicted in FIG. 6 can be caused by either the in-phase data signal 116-A or the quadrature-phase data signal 116-B having a DC offset component 116-A-2 or 116-B-2, respectively. Either contributing source to the LO leakage signal 128-B is therefore caused by baseband DC offsets within the baseband section of the conventional wireless transmitter 100.

DC imbalances between the first and second differential components of the in-phase data signal 116-A and between the first and second differential components of the quadrature-phase data signal 116-B are caused by device mismatches in the baseband section of the conventional wireless transmitter 100. Specifically, device mismatches within the DACs 110-A and 110-B, the LPFs 112-A and 112-B or the transconductance stages 114-A and 114-B can contribute to the generation of the DC component 116-A-2 within the in-phase data signal 116-A or the DC component 116-B-2 within the quadrature-phase data signal 116-B, respectively. Under ideal conditions, the constituent components of each device within the baseband portion of the conventional wireless transmitter 100 are identical and perfectly matched. However, under typical manufacturing and operating scenarios, device mismatch is non-negligible and contributes to the generation of the LO leakage signal 128-B as depicted in FIG. 6.

The conventional wireless transmitter 100 need only transmit the main information signal component 128-A of the transmitter output signal 128 to a corresponding wireless receiver to enable the transfer of information. Generally, the main information signal component 128-A is not a single tone as depicted in FIG. 6. Rather, in many applications, the main information signal component 128-A has a continuous bandwidth approximately equal to $2 \cdot f_{BB}$ and approximately centered about the LO frequency $f_{LO}$. Therefore, when the LO leakage signal 128-B is present within the up-converted modulated signal 128, the LO leakage signal 128-B can be approximately centered in the middle of the main information signal component 128-A. As a result, the LO leakage signal 128-B can interfere with the subsequent detection and demodulation of the main information signal component 128-B by a corresponding wireless receiver. In turn, the spectrum mask and modulation quality of the up-converted modulated signal 128 suffers when the LO leakage signal 128-B is present.

LO leakage is a measure of a difference in power between the main information signal component 128-A and the LO leakage signal 128-B. LO leakage reduction techniques are often used to improve the quality of the transmitter output signal 134 (i.e., reduce the power of the LO leakage signal 128-B). Many conventional LO leakage reduction techniques employ complicated DC calibration circuits. The DC calibration circuits are often designed to compensate for DC offsets within the in-phase and quadrature-phase signal paths prior to up-conversion. Conventional LO leakage reduction techniques using DC calibration circuits introduce many additional components into the design of a wireless transmitter. In turn, design and operation costs are increased. Further, DC calibration circuits must be updated or adjusted every time the gain of the transmitter is changed or every time the operating point of the transmitter is changed. Overall, initial calibration and re-calibration can be time-consuming, complicated and expensive to implement.

The conventional wireless transmitter 100 is incapable of reducing the power of the LO leakage signal 128-B. That is, the conventional wireless transmitter 100 has no mechanism by which the LO leakage signal 128-B can be reduced or eliminated. Therefore, what is needed is a wireless transmitter that is capable of reducing the power of the LO leakage signal 128-B to improve the quality of the transmitter output signal 134. Specifically, what is needed is a wireless transmitter having a LO leakage reduction mechanism that can reduce or eliminate a LO leakage signal caused by baseband DC offsets within one or more baseband signal paths of the transmitter. Further, the wireless transmitter should employ a LO leakage reduction mechanism that is high-speed, efficient and low cost.

Figure 7:
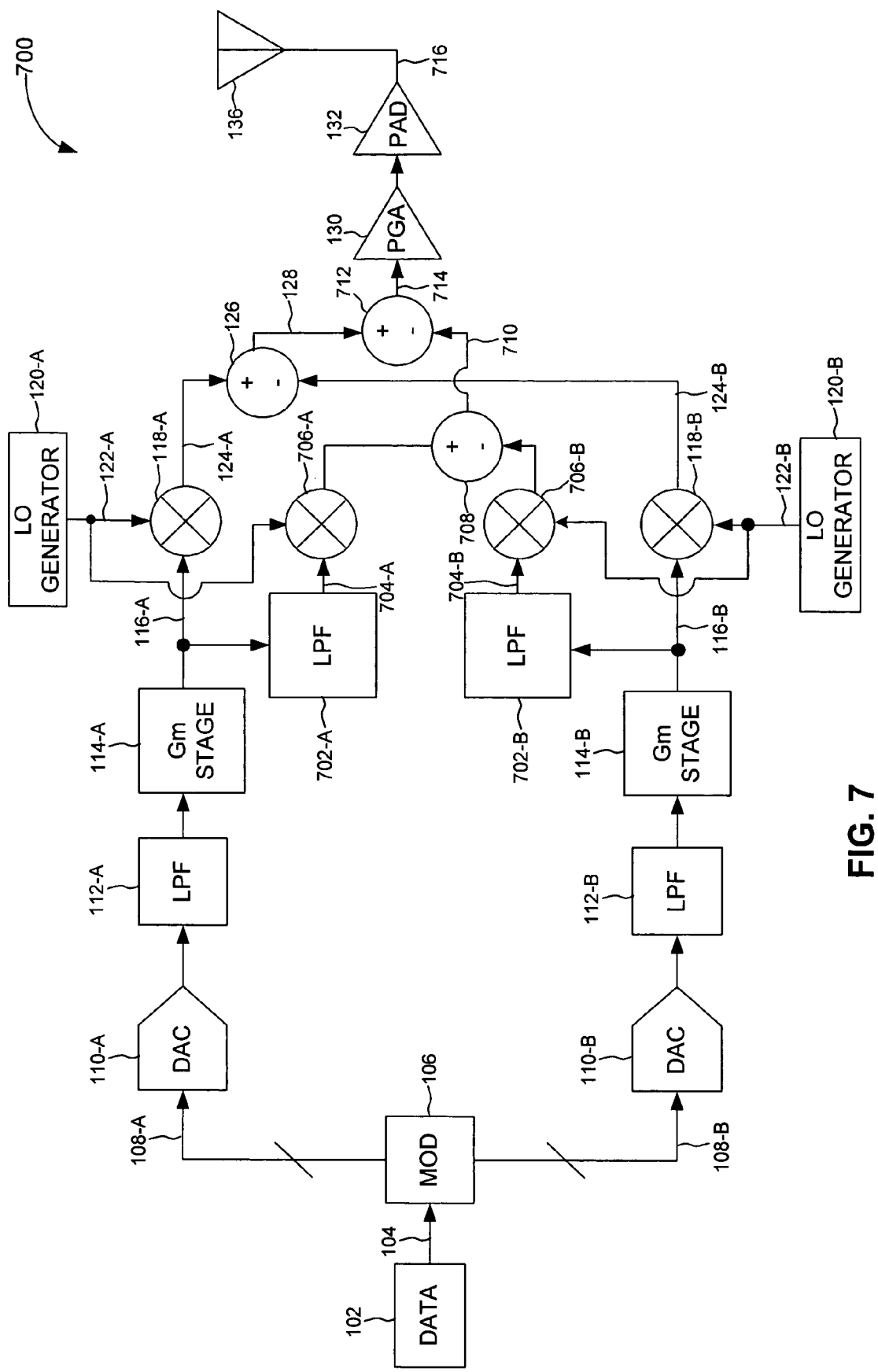
FIG. 7 illustrates a wireless transmitter having LO leakage cancellation for reducing a LO leakage signal within a transmitter output signal according to the present invention.

FIG. 7 illustrates a wireless transmitter 700 capable of reducing or eliminating a LO leakage signal in a transmitter output signal caused by baseband DC offsets. Specifically, the wireless transmitter 700 separately up-converts the baseband DC offsets that cause the LO leakage signal and subtracts the resulting LO leakage correction signal from the transmitter output signal, thereby reducing or eliminating the LO leakage effect.

As shown in FIG. 7, the wireless transmitter 700 includes a low-pass filter 702-A. The low-pass filter 702-A is coupled between the output of the transconductance stage 114-A and the mixer 118-A. The low-pass filter 702-A filters the in-phase data signal 116-A to produce a first filtered signal 704-A. The low-pass filter 702-A is configured to filter or remove the main baseband signal component 116-A-1 from the in-phase data signal 116-A. As a result, the first filtered signal 704-A only includes the DC offset component 116-A-2 of the in-phase data signal 116-A.

The wireless transmitter 700 further includes a low-pass filter 702-B. The low-pass filter 702-B is coupled between the output of the transconductance stage 114-B and the mixer 118-B. The low-pass filter 702-B filters the in-phase data signal 116-B to produce a second filtered signal 704-B. The low-pass filter 702-B is configured to filter or remove the main baseband signal component 116-B-1 from the in-phase data signal 116-B. As a result, the second filtered signal 704-B only includes the DC offset component 116-B-2 of the in-phase data signal 116-B.

The first and second filtered signals 704-A and 704-B are used to generate a LO leakage correction signal. Specifically, the first filtered signal 704-A is coupled to a mixer 706-A. The mixer 706-A receives the in-phase LO signal 122-A and up-converts the first filtered signal 704-A to the LO frequency $f_{LO}$. Likewise, the second filtered signal 704-B is coupled to a mixer 706-B. The mixer 706-B receives the quadrature-phase LO signal 122-B and up-converts the second filtered signal 704-B to the LO frequency $f_{LO}$.

The up-converted first filtered signal 704-A and the up-converted second filtered signal 704-B are fed to an inverting summer 708. The inverting summer 708 subtracts the differential components of the up-converted second filtered signal 704-B from the corresponding differential components of the up-converted first filtered signal 704-A. In other words, the inverting summer 708 sums the up-converted first filtered signal 704-A with an inverted version of the up-converted second filtered signal 704-B. As a result, the inverting summer 708 produces a LO leakage correction signal 710. The LO leakage correction signal 710 can be represented as:

$$LO_{correction} = DC_{I,offset} \cos(2\pi f_{LO} t) - DC_{Q,offset} \sin(2\pi f_{LO} t) \quad (30)$$

Figure 8:
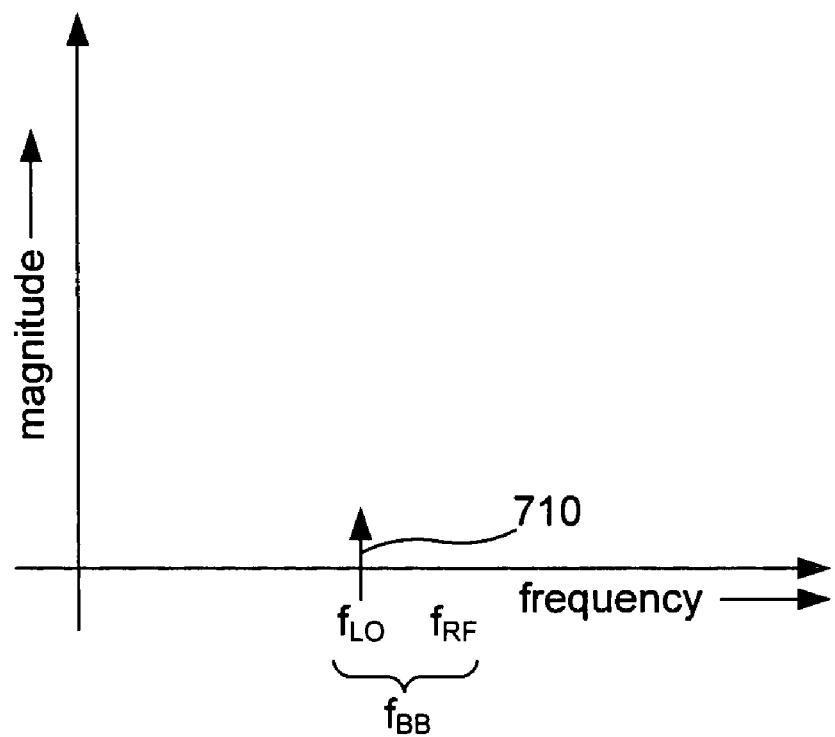
FIG. 8 illustrates a magnitude spectrum of a LO leakage correction signal having a LO leakage signal component only.

As shown by Equation 30, the LO leakage correction signal 710 is equivalent to the LO leakage signal component 128-B represented by Equation 29b and shown in FIG. 6. Specifically, both the power and frequency of the LO leakage correction signal 710 are substantially equal to the power and frequency of the LO leakage signal component 128-B. FIG. 8 illustrates a magnitude of the LO leakage correction signal 710. As shown in FIG. 8, the LO leakage correction signal 710 only includes a LO leakage signal component only.

As further shown in FIG. 7, the wireless transmitter 700 includes an inverting summer 712 to subtract the LO leakage correction signal 710 from the corresponding differential components of the up-converted modulated data signal 128. As a result, the inverting summer 712 produces a compensated up-converted output signal 714. The compensated up-converted output signal 714 can be represented as:

$$\hat{TX}_{output} = TX_{output} - LO_{correction} \quad (31)$$

$$= A\cos[2\pi(f_{LO} + f_{BB})t] \quad (32a)$$

$$+ DC_{I,offset}\cos(2\pi f_{LO} t) - DC_{Q,offset}\sin(2\pi f_{LO} t) \quad (32b)$$

$$- [DC_{I,offset}\cos(2\pi f_{LO} t) - DC_{Q,offset}\sin(2\pi f_{LO} t)] \quad (32c)$$

$$= A\cos[2\pi(f_{LO} + f_{BB})t] \quad (32d)$$

Figure 9:
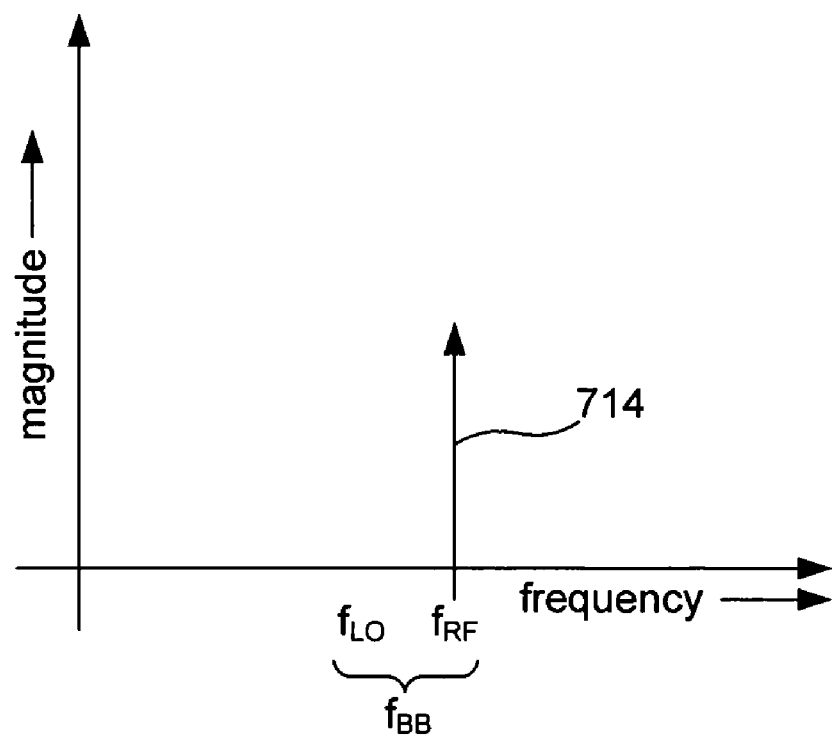
FIG. 9 illustrates a magnitude of the compensated up-converted output signal having a main signal component only.

FIG. 9 illustrates a magnitude of the compensated up-converted output signal 714. As shown in FIG. 9, the compensated up-converted output signal 714 includes a main signal component only. Specifically, the compensated up-converted output signal 714 is equivalent to the up-converted modulated signal 128 depicted in FIG. 4 (i.e., under ideal operating conditions). Overall, the LO leakage signal 128-B is reduced or eliminated. The compensated up-converted output signal 714 can be amplified by the PGA 130 and the PAD 132 to produce a compensated output signal 716.

The LO leakage signal cancellation provided by the present invention improves the quality of a transmitter output signal. Specifically, by separately up-converting the baseband DC offsets that cause the LO leakage signal and subsequently subtracting the resulting LO leakage correction signal from the transmitter output signal, the present invention reduces or eliminates a power of the LO leakage signal.

The LO leakage signal cancellation provided by the present invention is a simple and low cost solution to reducing the LO leakage effect that plagues many wireless transmitters. Specifically, the LO leakage signal cancellation of the present invention introduces minimal additional components. Further, the present invention provides a continuous correction or cancellation of the LO leakage effect by continuously isolating, up-converting and subtracting the baseband DC offsets (as a combined LO leakage cancellation signal) from a transmitter output signal. Alternatively, cancellation of the LO leakage effect in accordance with the present invention can occur when a power of the LO leakage signal exceeds a predetermined threshold as measured by a detector coupled to the output of the wireless transmitter 700. Overall, the present invention obviates the need for costly calibration circuits and the need to update calibration settings as the operation of the transmitter is adjusted. Therefore, the present invention provides LO leakage signal cancellation without the need for re-calibration or adjustment for each change in the operating point of the transmitter or for each change in the selected gain of the transmitter.

The present invention is not limited to the embodiment depicted in FIG. 7. That is, the present invention encompasses any transmitter apparatus that (a) isolates the one or more baseband DC offsets within one or more baseband signal paths that cause or enhance a LO leakage signal component of a transmitter output signal; (b) up-converts and combines each of the one or more baseband DC offsets to a frequency of the LO leakage signal so as to produce a replica, cancellation or correction signal approximately equal to the LO leakage signal in terms of power and frequency; and (3) subtracts the correction signal from the transmitter output signal so as to reduce or substantially eliminate a power of the LO leakage signal from the transmitter output signal. Therefore, the isolation, up-conversion, and subtraction (e.g., the arrangement of the inverting summers depicted in FIG. 7) can be modified to produce a LO leakage cancellation signal in accordance with the present invention.

Furthermore, the present invention can be extended to any transmitter having at least one signal path that produces a baseband DC offset such as, for example, a multi-channel transmitter or a single-channel transmitter.

The mixers depicted in FIG. 7 can be configured as Gilbert cells. Reduction of the power of the LO leakage signal 128-B can be improved as the mixers 706-A, 706-B, 118-A and 118-B more closely match one another (i.e., are identical devices).

In many applications, isolation of the DC components 116-A-2 and 116-B-2 can be improved if the bandwidths of the main information signal components 116-A-1 and 116-B-1 do not approach 0 Hz. That is, filtering out the main information signal components 116-A-1 and 116-B-1 can be improved if the signals do not occupy frequencies occupied by the spurious energy caused by the DC offsets 116-A-2 or 116-B-2, respectively. To ensure proper isolation of the DC offset components 116-A-2 and 116-B-2, for example, the main information signal components 116-A-1 and 116-B-1 can each be configured to have bandwidths approximately equal to:

$$\alpha \leq f_{BW,signal} \leq \beta \quad (33)$$

where α is a low frequency greater than the highest frequency generated by the DC offset component 116-A-2 or 116-B-2, $f_{BW,signal}$ is the bandwidth of the main information signal components 116-A-1 and 116-B-1, and β is a low baseband or IF frequency. Accordingly, the bandwidth of the LPFs 702-A and 702-B can be configured to have bandwidths approximately equal to:

$$f_{BW,LPF} < \alpha \tag{34}$$

such that the LPFs 702-A and 702-B only isolate the DC offset components 116-A-2 and 116-B-2.

Alternatively, if the main information signal components 116-A-1 and 116-B-1 do approach 0 Hz, then the LPFs 702-A and 702-B can be configured to have bandwidths approximately equal to:

$$f_{BW,LPF} < \gamma \tag{35}$$

where γ is a very low corner frequency of the LPFs 702-A and 702-B. Specifically, the bandwidths of the LPFs 702-A and 702-B can be configured to be very low relative to DC such that the LPFs isolate a minimal amount of the energy of the main information signal components 116-A-1 and 116-B-1 so as to not affect normal operation of the wireless transmitter 700.

FIG. 10 provides a flowchart 1000 that illustrates operational steps for reducing or eliminating a LO leakage signal in a transmitter output signal caused by baseband DC offsets in accordance with the present invention. The invention is not limited to this operational description. Rather, it will be apparent to persons skilled in the relevant art(s) from the teachings herein that other operational control flows are within the scope and spirit of the present invention. For example, the flowchart 1000 can be modified to provide LO leakage signal cancellation for single-channel or multiple-channel transmitters in accordance with the present invention. In the following discussion, the steps in FIG. 10 are described.

At step 1002, an in-phase baseband signal is generated. The in-phase baseband signal can be generated by modulating an information source. The in-phase baseband signal includes a first information signal component and a first DC offset component.

At step 1004, a quadrature-phase baseband signal is generated. The quadrature-phase baseband signal can also be generated by modulating the information source. The quadrature-phase baseband signal includes a second information signal component and a second DC offset component.

At step 1006, the in-phase baseband signal is up-converted using an in-phase LO signal to produce a first output signal.

At step 1008, the quadrature-phase baseband signal is up-converted using a quadrature-phase LO signal to produce a second output signal.

At step 1010, the first output signal and an inverted version of the second output signal are summed to produce a transmitter output signal. The transmitter output signal includes a main information signal component produced by the first and second information signal components. The transmitter output signal further includes a LO leakage signal component produced by the first and/or second DC offset components.

At step 1012, the in-phase baseband signal is filtered to produce a first cancellation signal. Filtering the in-phase baseband signal isolates the first DC offset component. As a result, the first cancellation signal is substantially equal to the first DC offset component in both power and frequency.

At step 1014, the quadrature-phase baseband signal is filtered to produce a second cancellation signal. Filtering the quadrature-phase baseband signal isolates the second DC offset component. As a result, the second cancellation signal is substantially equal to the second DC offset component in both power and frequency.

At step 1016, the first cancellation signal is up-converted using the in-phase LO signal to produce a first up-converted cancellation signal.

At step 1018, the second cancellation signal is up-converted using the quadrature-phase LO signal to produce a second up-converted cancellation signal.

At step 1020, the first up-converted cancellation signal and an inverted version of the second up-converted cancellation signal are summed to produce a LO leakage cancellation signal. The LO leakage cancellation signal is substantially equal to the LO leakage signal component of the transmitter output signal in both power and frequency.

At step 1022, the LO leakage cancellation signal is subtracted from the transmitter output signal. As a result, a power of the LO leakage signal is reduced or eliminated.

Step 1024 depicts the continuous LO leakage signal cancellation provided by the present invention. Specifically, in accordance with the present invention, the in-phase and quadrature-phase baseband signals are continuously filtered to isolate the first and second DC offset components. Further, the first and second isolated DC offsets are continuously up-converted and appropriately summed to produce the LO leakage cancellation signal.

Some or all of the operation steps depicted in the flowchart 1000 can be performed simultaneously to provide LO leakage signal cancellation in accordance with the present invention. Alternatively, a portion of the operation steps depicted in the flowchart 1000 can be performed when a power of the LO leakage signal exceeds a predetermined threshold.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A method for reducing a power of a local oscillator (LO) leakage signal in a transmitter output signal, comprising:
   generating the transmitter output signal from a first baseband signal having a first DC offset component and a second baseband signal having a second DC offset component, the transmitter output signal having a LO leakage signal component caused by the first and second DC offset components;
   generating a LO leakage cancellation signal from the first and second DC offset components; and
   subtracting the LO leakage cancellation signal from the transmitter output signal, thereby reducing the power of the LO leakage signal.

2. The method of claim 1, wherein generating the transmitter output signal comprises:
   up-converting the first baseband signal using a first LO signal to generate a first output signal;
   up-converting the second baseband signal using a second LO signal to generate a second output signal; and
   summing the first output signal and an inverted version of the second output signal to form the transmitter output signal.

3. The method of claim 1, wherein generating the LO leakage cancellation signal comprises:
   generating a first up-converted cancellation signal from the first DC offset component;
   generating a second up-converted cancellation signal from the second DC offset component; and
   summing the first up-converted cancellation signal and an inverted version of the second up-converted output signal to form the LO leakage cancellation signal.

4. The method of claim 3, wherein generating the first up-converted cancellation signal comprises generating a first baseband cancellation signal and up-converting the first baseband cancellation signal using the first LO signal.

5. The method of claim 4, wherein generating the first baseband cancellation signal comprises filtering the first baseband signal to isolate the first DC offset component.

6. The method of claim 3, wherein generating the second up-converted cancellation signal comprises generating a second baseband cancellation signal and up-converting the second baseband cancellation signal using the second LO signal.

7. The method of claim 6, wherein generating the second baseband cancellation signal comprises filtering the second baseband signal to isolate the second DC offset component.

8. A transmitter, comprising:
   a first mixer to produce a first output signal by up-converting a first DC offset component of a first baseband signal using a first local oscillator (LO) signal;
   a second mixer to produce a second output signal by up-converting a second DC offset component of a second baseband signal using a second LO signal; and
   an inverting summer to sum the first output signal with an inverted version of the second output signal to produce a LO leakage cancellation signal;
   wherein the transmitter subtracts the LO leakage cancellation signal from a transmitter output signal having a LO leakage signal.

9. The transmitter of claim 8, wherein the LO leakage signal is caused by at least one of the DC offset components.

10. The transmitter of claim 8, wherein subtracting the LO leakage cancellation signal from the transmitter output signal reduces a power of the LO leakage signal.

11. The transmitter of claim 8, wherein the transmitter output signal is produced from the first and second baseband signals.

12. The transmitter of claim 11, further comprising:
   a third mixer to produce a third output signal by up-converting the first baseband signal using the first LO signal;
   a fourth mixer to produce a fourth output signal by up-converting the second baseband signal using the second LO signal;
   a second inverting summer to sum the third output signal with an inverted version of the fourth output signal to produce the transmitter output signal.

13. The transmitter of claim 12, wherein the first, second, third and fourth mixers are matched.

14. The transmitter of claim 8, further comprising:
   a first filter to filter the first baseband signal to isolate the first DC offset component for input to the first mixer; and
   a second filter to filter the second baseband signal to isolate the second DC offset component for input to the second mixer.

15. A method for reducing a power of a local oscillator (LO) leakage signal in a transmitter output signal, comprising:
   generating the transmitter output signal from a baseband signal having a DC offset component, the transmitter output signal having a LO leakage signal component caused by the DC offset component;
   generating a LO leakage cancellation signal from the DC offset component; and
   subtracting the LO leakage cancellation signal from the transmitter output signal, thereby reducing the power of the LO leakage signal.

16. The method of claim 15, wherein generating the transmitter output signal comprises up-converting the baseband signal using a LO signal.

17. The method of claim 16, wherein generating the LO leakage cancellation signal comprises filtering the baseband signal to isolate the DC offset component.

18. The method of claim 17, wherein generating the LO leakage cancellation signal further comprises up-converting the isolated DC offset component using the LO signal.

19. A transmitter, comprising:
   a first mixer to up-convert a baseband signal using a LO signal to produce a transmitter output signal, the transmitter output signal having a LO leakage signal component caused by a DC offset component of the baseband signal;
   a filter to filter the baseband signal to isolate the DC offset component; and
   a second mixer to up-convert the isolated DC offset component using the LO signal to produce a LO leakage cancellation signal;
   wherein the transmitter subtracts the LO leakage cancellation signal from the transmitter output signal to reduce a power of the LO leakage signal.

20. A method for reducing a power of a local oscillator (LO) leakage signal in a transmitter output signal, comprising:
   generating the transmitter output signal from one or more baseband signals, at least one of the one or more baseband signals having a DC offset component, each DC offset component contributing to a LO leakage signal component of the transmitter output;
   generating a LO leakage cancellation signal from each DC offset component;
   subtracting the LO leakage cancellation signal from the transmitter output signal, thereby reducing the power of the LO leakage signal.

* * * * *